(12) United States Patent
Ahn et al.

(10) Patent No.: US 7,309,883 B2
(45) Date of Patent: Dec. 18, 2007

(54) SEMICONDUCTOR DEVICE CAPABLE OF PREVENTING CURRENT FLOW CAUSED BY LATCH-UP AND METHOD OF FORMING THE SAME

(75) Inventors: Soon-Hong Ahn, Suwon-si (KR); Jung-Hwa Lee, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/815,448

(22) Filed: Apr. 1, 2004

(65) Prior Publication Data

US 2004/0217427 A1    Nov. 4, 2004

(30) Foreign Application Priority Data

May 2, 2003    (KR)    .................. 10-2003-0028176

(51) Int. Cl.
H01L 29/72    (2006.01)

(52) U.S. Cl. .................. 257/173; 257/355; 257/370; 257/361; 257/E27.063

(58) Field of Classification Search ........ 257/370–373, 257/361, 497, 378, 173, 355, E27.063, E21.061
See application file for complete search history.

(56) References Cited

U.S. PATENT DOCUMENTS

| | | | | |
|---|---|---|---|---|
| 5,330,922 A | * | 7/1994 | Erdeljac et al. | 438/207 |
| 5,576,557 A | * | 11/1996 | Ker et al. | 257/173 |
| 5,652,456 A | * | 7/1997 | Lien | 257/370 |
| 5,889,309 A | * | 3/1999 | Yu et al. | 257/363 |
| 5,894,145 A | * | 4/1999 | Chen et al. | 257/296 |
| 5,991,182 A | * | 11/1999 | Novac et al. | 363/126 |
| 6,025,621 A | * | 2/2000 | Lee et al. | 257/296 |
| 6,072,219 A | * | 6/2000 | Ker et al. | 257/355 |
| 6,291,303 B1 | * | 9/2001 | Tung | 438/336 |
| 6,320,232 B1 | * | 11/2001 | Gossner et al. | 257/360 |
| 6,514,785 B1 | * | 2/2003 | Chiang et al. | 438/48 |
| 6,690,067 B2 | * | 2/2004 | Ker et al. | 257/355 |
| 6,747,294 B1 | * | 6/2004 | Gupta et al. | 257/127 |
| 6,765,771 B2 | * | 7/2004 | Ker et al. | 361/56 |
| 6,800,906 B2 | * | 10/2004 | Cheng | 257/355 |
| 6,801,079 B2 | * | 10/2004 | Marotta et al. | 327/539 |
| 6,847,059 B2 | * | 1/2005 | Tsuji et al. | 257/173 |
| 6,858,901 B2 | * | 2/2005 | Ker et al. | 257/360 |
| 6,864,537 B1 | * | 3/2005 | Mallikarjunaswamy | 257/355 |
| 6,972,463 B2 | * | 12/2005 | Cheng | 257/365 |
| 6,998,670 B2 | * | 2/2006 | Lojek | 257/315 |
| 2005/0012155 A1 | * | 1/2005 | Ker et al. | 257/355 |

* cited by examiner

*Primary Examiner*—Thao X. Le
(74) *Attorney, Agent, or Firm*—F. Chau & Associates, LLC.

(57) ABSTRACT

A semiconductor device includes first, second, and third wells. The first well is connected to a pad to which an external pin is connected and includes a first-type diffusion region that receives a well bias voltage. The second well is adjacent to the first well, and includes an insulating region and a second-type diffusion region outside the insulating region. The third well is adjacent to the second well and includes a first-type diffusion region that receives a first voltage. The insulating region inside the second well along with the first-type well diffusion region of the first well constitute a bipolar junction transistor that cuts off current flowing from the first well to the third well.

24 Claims, 4 Drawing Sheets

SEMICONDUCTOR DEVICE CAPABLE OF PREVENTING CURRENT FLOW CAUSED BY LATCH-UP AND METHOD OF FORMING THE SAME

BACKGROUND

This application claims the priority of Korean Patent Application No. 2003-28176, filed on May 2, 2003, in the Korean Intellectual Property Office, the disclosure of which is incorporated herein in its entirety by reference.

1. Technical Field

The present disclosure relates to semiconductor devices, and more particularly, to semiconductor devices capable of preventing current flow caused by latch-up.

2. Discussion of Related Art

To perform a current test, a high voltage is applied to a bonding pad of a semiconductor device, which causes a current to flow in the semiconductor device. As such, defects occur in the semiconductor device, and the semiconductor device cannot operate properly.

FIG. 1 is a cross-sectional view of a layout of a conventional semiconductor device. FIG. 2 is a plane view of the semiconductor device of FIG. 1.

Referring to FIGS. 1 and 2, a P-type diffusion region 110 and an N-type diffusion region 120 are located in a first N-well NW1, and a P-type diffusion region 130 is located in an adjacent P-well PW. An N-type diffusion region 140 is located in a second N-well NW2 adjacent to the P-well PW.

A pad P1 is connected to the P-type diffusion region 110 of the first N-well NW1. A power supply voltage VDD is connected to the N-type diffusion region 120 of the first N-well NW1, and a ground voltage VSS is connected to the P-type diffusion region 130 of the P-well PW and the N-type diffusion region 140 of the second N-well NW2.

The P-type diffusion region 110 and the N-type diffusion region 120 of the first N-well NW1 and the P-type diffusion region 130 of the P-well PW, respectively, constitute an emitter, a base, and a collector of a first bipolar junction transistor (BJT) Q1. The N-type diffusion region 120 of the first N-well NW1, the P-type diffusion region 130 of the P-well PW, and the N-type diffusion region 140 of the second N-well NW2, respectively, constitute a collector, a base, and an emitter of a second bipolar junction transistor (BJT) Q2.

The first BJT Q1 is a PNP-type transistor, and the second BJT Q2 is an NPN-type transistor. Rn and Rnw represent the loads of the base and the emitter of the first BJT Q1 respectively. Rpw represents the load of the emitter of the second BJT Q2.

When a backward voltage is applied between the N-type diffusion region 120 (base B) of the first N-well NW1 and the P-type diffusion region 130 (collector C) of the P-well PW of the first BJT Q1, respectively, and then a forward voltage is applied between the P-type diffusion region 110 (emitter A) of the first N-well NW1 and the N-type diffusion region 120 (base B) of the first N-well NW1, the first BJT Q1 is activated, and a current IC1 flows through the first BJT Q1.

When performing a current test, a high voltage, i.e., a voltage higher than a voltage obtained by adding a turn-on voltage of a PN junction to the power supply voltage VDD, is applied to the pad P1, and thus the first BJT Q1 is activated.

When a backward voltage is applied between the N-type diffusion region 120 (collector B) of the first N-well NW1 and the P-type diffusion region 130 (base C) of the P-well PW of the second BJT Q2, and then a forward voltage is applied between the P-type diffusion region 130 (base C) of the P-well PW and the N-type diffusion region 140 (emitter D) of the second N-well NW2, the second BJT Q2 is activated.

When the voltage difference between the P-type diffusion region 130 (base C) of the P-well PW and the N-type diffusion region 140 (emitter D) of the second N-well NW2 of the second BJT Q2 is greater than the turn-on voltage, due to a resistor Rp, a forward voltage is applied between the P-type diffusion region 130 (base C) of the P-well PW and the N-type diffusion region 140 (emitter D) of the second N-well NW2, the second BJT Q2 is activated, and a current IC2 flows through the second BJT Q2.

Accordingly, a current path is formed between the P-type diffusion region 110 of the first N-well NW1 and the N-type diffusion region 140 of the second N-well NW2, and a current flows along the current path. This phenomenon is referred to as latch-up and causes defects in semiconductor devices.

SUMMARY OF THE INVENTION

A semiconductor device according to an embodiment of the invention includes a first well, a second well, and a third well.

The first well is connected to a pad to which an external pin is connected and includes a first-type diffusion region that receives a well bias voltage. The second well is adjacent to the first well, and includes an insulating region and at least one second-type diffusion region outside the insulating region.

The third well is adjacent to the second well and includes a first-type diffusion region that receives a first voltage.

The insulating region inside the second well along with the first-type diffusion region of the first well constitute a bipolar junction transistor which cuts off current flowing from the first well to the third well.

The second well comprises a first sub-well, which is arranged between the insulating region and the first well and includes a first second-type diffusion region, and a second sub-well, which is arranged between the insulating region and the third well and includes a second second-type diffusion region. The insulating region is a third sub-well having a first-type diffusion region.

The first sub-well is a P-well, and the first voltage is applied to the second-type diffusion region of the first sub-well. The second sub-well is a P-well, and the first voltage is applied to the second-type diffusion region of the second sub-well.

The third sub-well is an N-well, and a second voltage is applied to the first-type diffusion region of the third sub-well. The first voltage is a ground voltage, and the second voltage is a voltage that generates a backward voltage between a base and an emitter of a bipolar junction transistor, which is composed of the first-type diffusion region of the first well, the second-type diffusion region of the first sub-well, and the first-type diffusion region of the third sub-well.

The first and third wells are N-wells. The well bias voltage applied to the first-type diffusion region of the first well is a power supply voltage. A region to which the pad is connected is a second-type diffusion region.

The first-type diffusion regions are formed of N-type impurities, and the at least one second-type diffusion region is formed of P-type impurities. The insulating region of the second well has a structure that surrounds the first well.

The third well constitutes a depletion-type MOS transistor. A semiconductor device according to another embodiment of the invention includes a first N-well, a first P-well, and a second N-well.

The first N-well is connected to a pad to which an external pin is connected and includes an N-type diffusion region that receives a well bias voltage, and a P-type diffusion region formed in the vicinity of the pad.

The first P-well is adjacent to the first N-well, and includes an insulating region and at least one P-type diffusion region that receives a ground voltage outside the insulating region.

The second N-well is adjacent to the first P-well and includes an N-type diffusion region that receives the ground voltage. The insulating region is a third N-well having an N-type diffusion region that receives a control voltage.

The first P-well includes a first sub-P-well, which is located between the insulating region and the first N-well and includes a first P-type diffusion region, and a second sub-P-well, which is located between the insulating region and the second N-well and includes a second P-type diffusion region.

The N-type diffusion region of the first N-well, the P-type diffusion region of the first sub-P-well, and the N-type diffusion region of the insulating region constitute a bipolar junction transistor that cuts off a current flowing from the first N-well to the second N-well.

A method of forming a semiconductor device according to an embodiment of the invention includes forming a first well connected to a pad to which an external pin is connected. The first well includes a first-type diffusion region that receives a well bias voltage. A second well is formed adjacent to the first well and includes an insulating region and at least one second-type diffusion region outside the insulating region. A third well is formed adjacent to the second well and includes a first-type diffusion region that receives a first voltage. The insulating region inside the second well along with the first-type diffusion region of the first well constitute a bipolar junction transistor which cuts off current flowing from the first well to the third well.

BRIEF DESCRIPTION OF THE DRAWINGS

Exemplary embodiments of the present invention will be described in detail with reference to the attached drawings in which.

DESCRIPTION OF PREFERRED EMBODIMENTS

Figure 1:
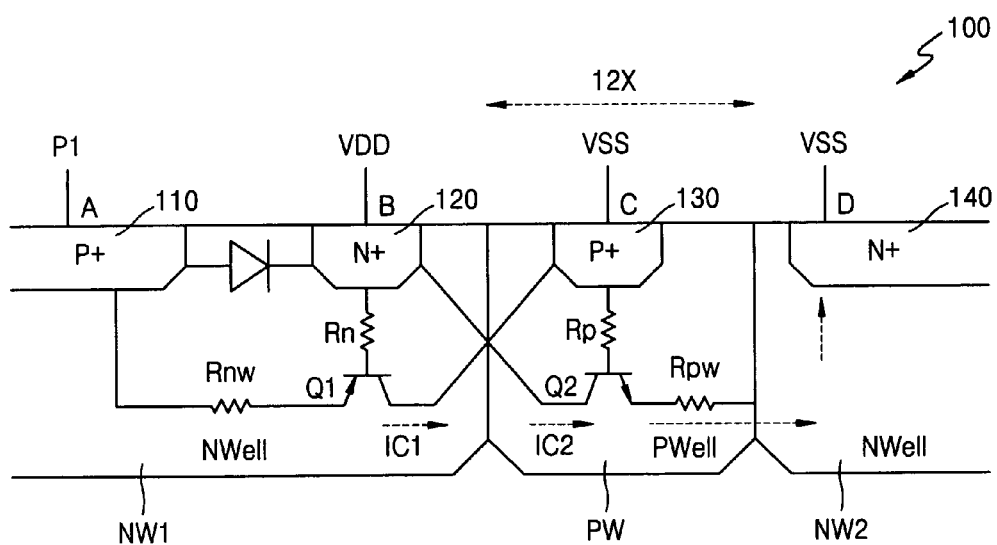
FIG. 1 is a cross-sectional view of a layout of a conventional semiconductor device.
Figure 2:
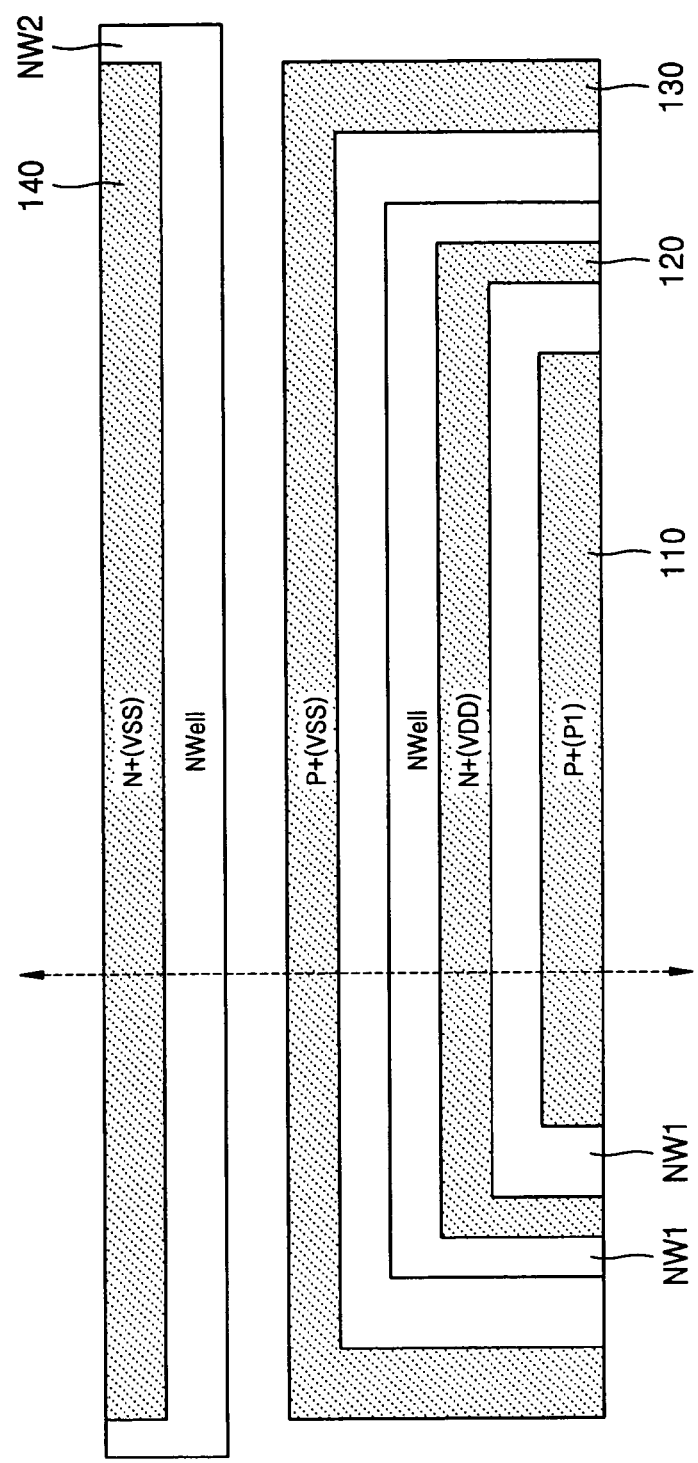
FIG. 2 is a plane view of the semiconductor device of FIG. 1.

The present invention will be described in detail by describing preferred embodiments of the invention with reference to the accompanying drawings. Like reference numerals refer to like elements throughout the figures.

Figure 3:
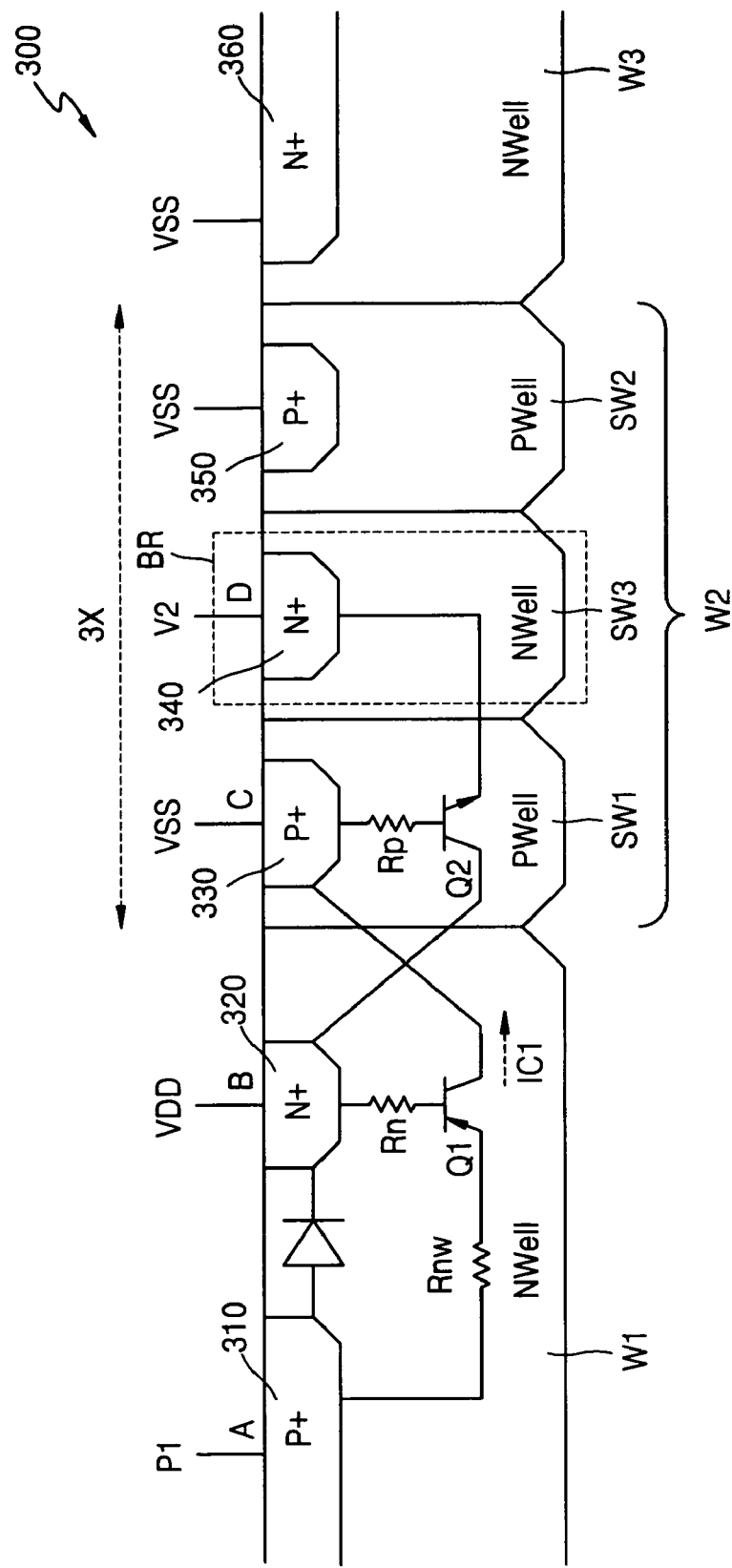
FIG. 3 is a cross-sectional view of a layout of a semiconductor device according to an exemplary embodiment of the present invention.
Figure 4:
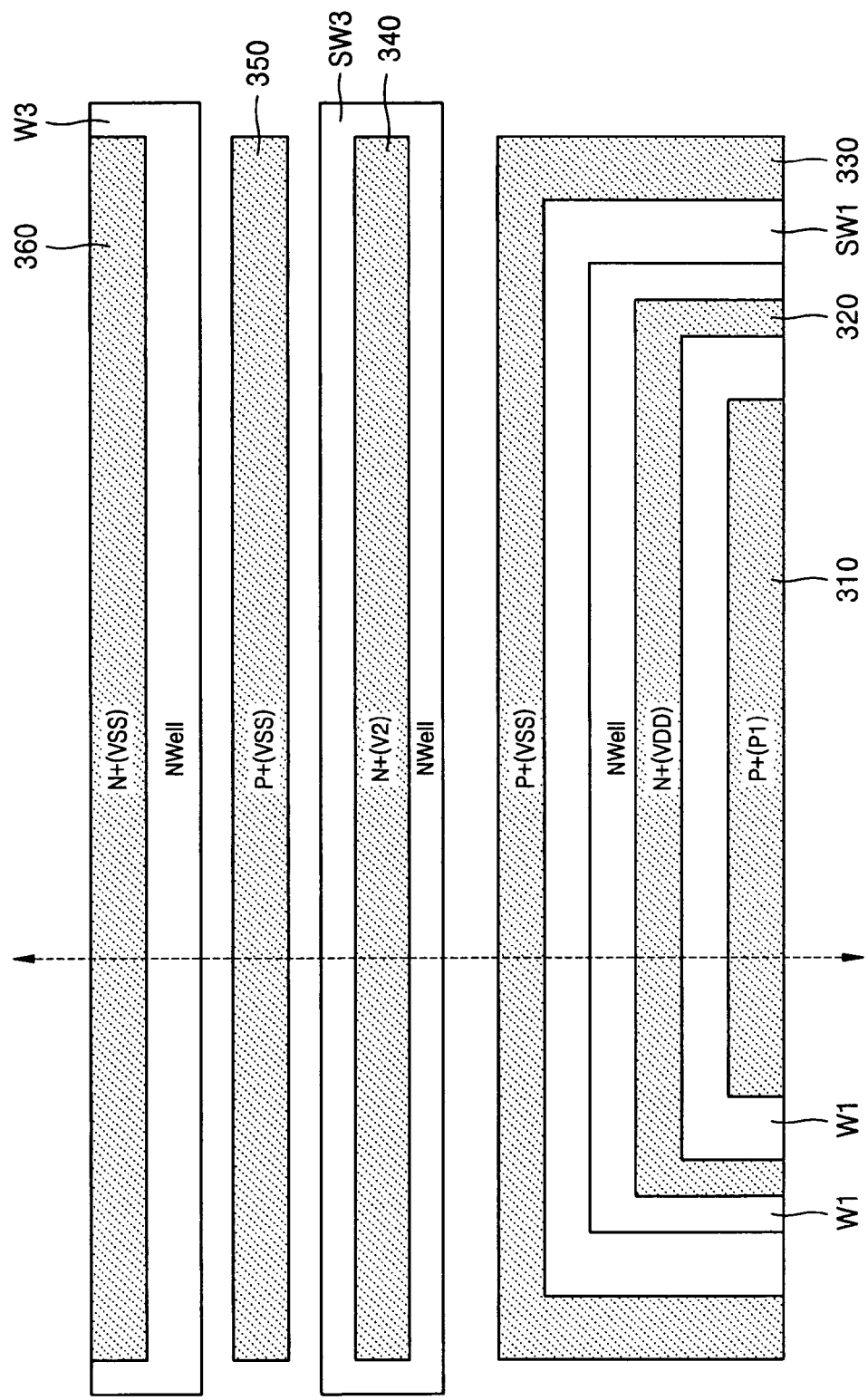
FIG. 4 is a plane view of the semiconductor device of FIG. 3.

FIG. 3 is a cross-sectional view of a layout of a semiconductor device according to an exemplary embodiment of the present invention, and FIG. 4 is a plane view of the semiconductor device of FIG. 3.

Referring to FIGS. 3 and 4, a semiconductor device 300 according to the present embodiment of the invention includes a first well W1, a second well W2, and a third well W3. The first well W1 is connected to a pad P1 to which an external pin is connected and includes a first-type diffusion region 320 that receives a well bias voltage VDD. The second well W2 is adjacent to the first well W1, and includes a predetermined insulating region BR. The second well W2 further includes second-type diffusion regions 330 and 350 outside the insulating region BR.

The third well W3 is adjacent to the second well W2 and includes a first-type diffusion region 360 to which a first voltage VSS is applied. The insulating region BR inside the second well W2 with the first-type diffusion region 320 of the first well W1 constitute a bipolar junction transistor (BJT) Q1 which cuts off current flowing from the first well W1 to the third well W3.

Hereinafter, the operation of the semiconductor device according various exemplary embodiments of the present invention will be described with reference to FIGS. 3 and 4.

The first well W1 is an N-well, and the well bias voltage VDD is a power supply voltage. The first-type diffusion region 320 of the first well W1 is formed of N-type impurities. The pad P1 is connected to a second-type diffusion region 310. The second-type diffusion region 310 is formed of P-type impurities.

The second well W2 includes a first sub-well SW1, a second sub-well SW2, and a third sub-well SW3. The first sub-well SW1 is located between the insulating region BR and the first well W1 and includes the second-type diffusion region 330. The second sub-well SW2 is located between the insulating region BR and the third well W3 and includes the second-type diffusion region 350. The insulating region BR is the third sub-well SW3 having a first-type diffusion region 340.

The first sub-well SW1 is a P-well, and the first voltage VSS is applied to the second-type diffusion region 330 of the first sub-well SW1. The second sub-well SW2 is a P-well, and the first voltage VSS is applied to the second-type diffusion region 350 of the second sub-well SW2.

The third sub-well SW3 is an N-type well, and a second voltage V2 is applied to the first-type diffusion region 340 of the third sub-well SW3. The third well W3 may constitute a depletion-type MOS transistor, and the first voltage VSS is a ground voltage. The second well W2 may also be viewed as a P-type well in which the insulating region BR is formed.

The first well W1 and the first sub-well SW1 constitute a PNP-type bipolar junction transistor (BJT) Q1. When a backward voltage is applied between the N-type diffusion region 320 (base B) in the first well W1 and the P-type diffusion region 330 (collector C) in the first sub-well SW1 of the PNP-type BJT Q1, and then a forward voltage is applied between the P-type diffusion region 310 (emitter A) in the first well W1 and the N-type diffusion region 320 (base B) in the first well W1, the PNP-type BJT Q1 is activated, and a current IC1 flows through the PNP-type BJT Q1.

If a current test is performed on the semiconductor device, a high voltage, i.e., a voltage having a higher level than a voltage obtained by adding a turn-on voltage of PN junction to a power supply voltage VDD, is applied to the pad P1 and the PNP-type BJT Q1 is activated. Thus, the current IC1 flows through the PNP-type BJT Q1.

The first-type diffusion region 320 of the first well W1, the second-type diffusion region 330 of the first sub-well SW1, and the first-type diffusion region 340 of the third sub-well SW3 constitute an NPN-type bipolar junction transistor (BJT) Q2.

The voltage V2 applied to the first-type diffusion region 340 of the third sub-well SW3 is adjusted so that there exists a backward voltage between the N-type diffusion region 340 (emitter D) in the third sub-well SW3 and the P-type diffusion region 330 (base C) in the first sub-well SW1 of the NPN-type BJT Q2. Thus, the current IC1 cannot flow to the third well W3, and latch-up is prevented. When the voltage V2 is applied to prevent latch-up, the NPN-type BJT Q2 is in a cut-off mode.

The insulating region BR is located inside the second well W2 so that the NPN-type BJT Q2 includes the first-type diffusion region 320 of the first well W1 and will cut-off current flowing from the first well W1 to the third well W3.

Thus, during a current test of the semiconductor device 300, even though a high voltage is applied to the pad P1, current flow caused by latch-up can be prevented so that defects do not occur in the semiconductor device 300.

The area of the layout of the second well W2 of the semiconductor device 300 can also be reduced to about 25% of the area of the conventional P-well PW shown in FIG. 1. If the width of the conventional P-well PW of FIG. 1 is indicated by 12X (where X is a basic unit of length), the width of the layout of the second well W2 of FIG. 3 may be indicated by about 3X.

Referring to FIG. 4, the insulating region BR of the second well W2 has a structure that surrounds the first well W1. The insulating region BR of the second well W2, i.e., the third sub-well SW3, has to surround the first well W1 to which the pad P1 is connected, or has to be arranged parallel to the first well W1 and between the first well W1 and the third well W3, so that the current IC1 generated in the first well W1 can be effectively prevented.

As described above, in the semiconductor device according to various exemplary embodiments of the present invention, when a high voltage is applied to a pad during a current test, current flow caused by latch-up is prevented, which in turn prevents defects from occurring in the semiconductor device.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor device comprising:
a first well connected to a pad to which an external pin is connected, the first well including a first-type diffusion region connected to a bias voltage terminal;
a second well adjacent to the first well, the second well including an insulating region having a first-type diffusion region and at least one second-type diffusion region outside the insulating region, wherein the at least one second-type diffusion region of the second well is connected to a first voltage terminal, and wherein the first-type diffusion region of the insulating region is connected to a second voltage terminal; and
a third well adjacent to the second well and including a first-type diffusion region connected to the first voltage terminal,
wherein the insulating region inside the second well, the at least one second-type diffusion region of the second well, and the first-type diffusion region of the first well, constitute a bipolar junction transistor which operates in a cut-off mode to cut off current from flowing from the first well to the third well when a control voltage is applied to the second voltage terminal.

2. The semiconductor device of claim 1, wherein the at least one second-type diffusion region outside the insulating region comprises a first second-type diffusion region and a second second-type diffusion region, and the second well comprises:
a first sub-well arranged between the insulating region and the first well and including the first second-type diffusion region; and
a second sub-well arranged between the insulating region and the third well and including the second second-type diffusion region,
wherein the insulating region is a third sub-well having the first-type diffusion region.

3. The semiconductor device of claim 2, wherein the first and second sub-wells of the second well are P-wells, and the second-type diffusion regions of the first and second sub-wells of the second well are each connected to the first voltage terminal.

4. The semiconductor device of claim 2, wherein the third sub-well is an N-well.

5. The semiconductor device of claim 4, wherein a voltage applied to the first voltage terminal is a ground voltage, and the control voltage generates a backward voltage between a base and an emitter of a bipolar junction transistor, the bipolar junction transistor comprising the first-type diffusion region of the first well, the second-type diffusion region of the first sub-well, and the first-type diffusion region of the third sub-well.

6. The semiconductor device of claim 1, wherein the first and third wells are N-wells.

7. The semiconductor device of claim 1, wherein the well bias voltage applied to the first-type diffusion region of the first well is a power supply voltage.

8. The semiconductor device of claim 1, wherein a region to which the pad is connected is a second-type diffusion region.

9. The semiconductor device of claim 1, wherein the first-type diffusion regions are formed of N-type impurities, and the at least one second-type diffusion region is formed of P-type impurities.

10. The semiconductor device of claim 1, wherein the insulating region of the second well has a structure that surrounds the first well.

11. The semiconductor device of claim 1, wherein the third well constitutes a depletion-type MOS transistor.

12. A semiconductor device comprising:
a first N-well connected to a pad to which an external pin is connected, the first N-well including an N-type diffusion region connected to a bias voltage terminal, and a P-type diffusion region formed in the vicinity of the pad;
a first P-well adjacent to the first N-well, the first P-well including an insulating region and at least one P-type diffusion region outside the insulating region, the at least one P-type diffusion region of the first P-well outside of the insulating region is connected to a first voltage terminal; and
a second N-well adjacent to the first P-well and including an N-type diffusion region connected to the first voltage terminal,
wherein the insulating region is a sub-N-well embedded within said first P-well and having an N-type diffusion region connected to a second voltage terminal for receiving an off mode control voltage for preventing a latch-up current.

13. The semiconductor device of claim 12, wherein the at least one P-type diffusion region comprises a first P-type diffusion region and a second P-type diffusion region and the first P-well comprises:
   a first sub-P-well located between the insulating region and the first N-well and including the first P-type diffusion region; and
   a second sub-P-well located between the insulating region and the second N-well and including the second P-type diffusion region.

14. The semiconductor device of claim 13, wherein the N-type diffusion region of the first N-well, the P-type diffusion region of the first sub-P-well, and the N-type diffusion region of the insulating region constitute a bipolar junction transistor which cuts off a current flowing from the first N-well to the second N-well.

15. The semiconductor device of claim 14, wherein the control voltage provided to the second voltage terminal generates a backward voltage between a base and an emitter of the bipolar junction transistor composed of the N-type diffusion region of the first N-well, the P-type diffusion region of the first sub-P-well, and the N-type diffusion region of the insulating region.

16. The semiconductor device of claim 12, wherein the bias voltage terminal connected to the N-type diffusion region of the first N-well is adapted to receive a power supply voltage for the semiconductor device.

17. The semiconductor device of claim 12, wherein the insulating region of the first P-well has a structure that surrounds the first N-well.

18. The semiconductor device of claim 12, wherein the second N-well constitutes a depletion-type MOS transistor.

19. A method of forming a semiconductor device comprising:
   forming a first well connected to a pad to which an external pin is connected, the first well including a first-type diffusion region connected to a bias voltage terminal;
   forming a second well adjacent to the first well, the second well including an insulating region having a first-type diffusion region and at least one second-type diffusion region outside the insulating region, wherein the at least one second-type diffusion region of the second well is connected to a first voltage terminal, and the first-type diffusion region of the insulating region is connected to a second voltage terminal; and
   forming a third well adjacent to the second well and including a first-type diffusion region connected to the first voltage terminal,
   wherein the insulating region inside the second well, the at least one second-type diffusion region of the second well outside of the insulating region and the first-type diffusion region of the first well constitute a bipolar junction transistor which operates in a cut-off mode to cut off current flowing from the first well to the third well when a control voltage is applied to the second voltage terminal.

20. The method of claim 19, wherein the at least one second-type diffusion region outside the insulating region comprises a first second-type diffusion region and a second second-type diffusion region, and the step of forming a second well comprises:
   forming a first sub-well between the insulating region and the first well, the first sub-well including the first second-type diffusion region; and
   forming a second sub-well between the insulating region and the third well, the second sub-well including the second second-type diffusion region,
   wherein the insulating region is a third sub-well having the first-type diffusion region.

21. The method of claim 20, wherein the first and second sub-wells of the second well are P-wells, and the second-type diffusion regions of the first and second sub-wells of the second well are each connected to the first voltage terminal.

22. The method of claim 20, wherein the third sub-well is an N-well.

23. The method of claim 19, wherein the first and third wells are N-wells.

24. The method of claim 19, wherein the first-type diffusion regions are formed of N-type impurities, and the at least one second-type diffusion region is formed of P-type impurities.

* * * * *